United States Patent [19]
Herrmann

[11] Patent Number: 5,594,799
[45] Date of Patent: Jan. 14, 1997

[54] CIRCUIT FOR SUPPRESSION OF SHORT-LIVED NOISE-PHENOMENA IN A DIGITAL AUDIO SIGNAL

[75] Inventor: Matthias Herrmann, Hildesheim, Germany

[73] Assignee: Blaupunkt-Werke GmbH, Hildesheim, Germany

[21] Appl. No.: 218,651

[22] Filed: Mar. 28, 1994

[30]   Foreign Application Priority Data

Apr. 3, 1993 [DE]   Germany .......................... 43 10 985.3

[51] Int. Cl.⁶ .................. H04H 5/00; H04B 1/10
[52] U.S. Cl. .................. 381/13; 455/222; 455/223; 455/296
[58] Field of Search .................. 381/13, 4, 1, 2; 455/221, 222, 223, 296, 317, 186.1, 186.2; 325/346, 351

[56]            References Cited

U.S. PATENT DOCUMENTS

| | | |
|---|---|---|
| 4,434,325 | 2/1984 | Kobayashi . |
| 4,554,668 | 11/1985 | Deman et al. ................ 375/1 |
| 4,593,392 | 6/1986 | Kouyama . |
| 4,947,440 | 8/1990 | Bateman et al. . |
| 5,091,943 | 2/1992 | Sakata ........................ 381/13 |
| 5,204,973 | 4/1993 | Sugayama ................... 455/222 |
| 5,349,699 | 9/1994 | Erben et al. ................. 455/186.1 |

FOREIGN PATENT DOCUMENTS

| | | |
|---|---|---|
| 0497115A3 | 8/1992 | European Pat. Off. . |
| 4039117A1 | 10/1991 | Germany . |
| 4129311 | 4/1992 | Japan . |
| 04129311 | 4/1992 | Japan . |

Primary Examiner—Curtis Kuntz
Assistant Examiner—Xu Mei
Attorney, Agent, or Firm—Frishauf, Holtz, Goodman, Langer & Chick, P.C.

[57]            ABSTRACT

In a circuit for suppressing short-lived noise phenomena in a digital audio signal, in particular during a temporary test reception of another transmitter, the audio signal is multiplied by a factor which, prior to the appearance of the noise phenomenon, is brought from a maximum value to a minimum value in accordance with a predetermined time function, and at the end of the noise phenomenon, is returned to a maximum value. The invention has special application to the Radio Data System defined by the European Broadcasting Union, and the testing of "Alternative Frequencies" in that system.

14 Claims, 2 Drawing Sheets

CIRCUIT FOR SUPPRESSION OF SHORT-LIVED NOISE-PHENOMENA IN A DIGITAL AUDIO SIGNAL

Cross-reference to related application, assigned to the assignee of the present invention, the disclosure of which is incorporated by reference: U.S. Ser. No. 08/183,029, VOGT & HERRMANN, filed 18 Jan. 1994.

CROSS-REFERENCE TO RELATED LITERATURE

European Broadcasting Union Technical Standard 3244-E, entitled SPECIFICATIONS OF THE RADIO DATA SYSTEM RDS FOR VHF/FM SOUND BROADCASTING (EBU Technical Centre, Brussels, Mar. '84, 60 pp.).

FIELD OF THE INVENTION

The invention relates to a circuit for suppressing short-lived noise phenomena in a digital audio signal, in particular during a temporary test reception of another transmitter.

BACKGROUND

It has become possible, in particular because of the introduction of the Radio Data System (RDS), wherein data are transmitted in addition to the audio signals, to briefly switch from a radio station being received to another frequency in order to check whether the same program can be better received on this other frequency. A noise phenomenon of the audio signal occurs during the test reception, which lasts approximately 25 ms, for example.

THE INVENTION

It is an object of the present invention to provide a circuit which damps the audio signal for suppressing brief noise phenomena without generating further noise phenomena ("crackling sounds") itself. The circuit in accordance with the invention is intended to be especially suited for digital signal processing.

In accordance with the invention the audio signal is multiplied by a factor which, prior to the appearance of the noise phenomenon, is brought from a maximum value to a minimum value in accordance with a predetermined time function, and at the end of the noise phenomenon is returned to a maximum value.

Other short-lived noise phenomena can also be filtered out by means of the circuit of the invention. All signals and signal processing steps are time- and value-discrete (digital), so that the circuit is suitable in an advantageous manner for a radio receiver which to a large extent is digital.

In accordance with a feature of the invention damping is done on the logarithmic scale, starting with the maximum value of the factor, first extends flat and then increasingly more steeply; and, to resume prior volume, the change in the factor beginning with a minimum value first extends steeply and then increasingly flatter. With this progression it is possible to achieve muting which to a large extent is "free of crackling".

In accordance with another feature of the invention, an integrator is provided for deriving the factor, which preferably consists of an adder and a delay of preferably one sampling period.

An advantageous design of this further development is characterized in that it is possible to provide the adder with respectively a value representing an integration increment and with the derived factor of the preceding sampling period, the output signal of the adder, delayed by one sampling period, can be supplied to an input of a multiplier and an input of a comparator. Another input of the comparator can be charged with a constant which represents the minimal value, and an output of the comparator is connected with a further input of the multiplier and the derived factor is available at the output of the multiplier.

According to another feature of the invention the sign of an integration can be controlled with the aid of a supplied control signal. This makes the simple control of the circuit of the invention possible. A control signal is merely required which has a first signal jump in good time prior to the start of an expected noise phenomenon and a second signal jump at the end of the noise phenomenon.

If, in accordance with another development, feature the value of an integration increment can be switched with the aid of another supplied control signal, it is possible, in addition to the rapid increase and decrease of damping control, to perform control at a slower speed, for example with a change of the signal source.

In a stereo radio receiver, multiply the audio signal of a left stereo channel are preferably multiplied and the audio signal of a right stereo channel with the factor.

DRAWINGS

FIG. 1 illustrates an exemplary embodiment of the invention in the form of a block circuit diagram, and FIG. 2 is a logarithmic illustration of the course of the factor and thus the damping of the audio signal.

DETAILED DESCRIPTION

The circuit of the invention can be implemented in various ways. For example, individual blocks or groups of the blocks illustrated can be implemented by means of suitable circuits, in particular integrated circuits. With a very high degree of integration, it is furthermore possible to implement the entire digital signal processing of the receiver in an integrated circuit, in which signal processing steps, such as filtering or non-linear weighting, are performed by calculating operations. It is also possible to mutually dispose digital signal processors and other digital circuits, such as shift registers, flip-flops, etc., within an integrated circuit for the implementation of a receiver with the circuit in accordance with the invention. Almost any conventional digital signal processor (DSP) is suitable for use in the invention.

Figure 1:
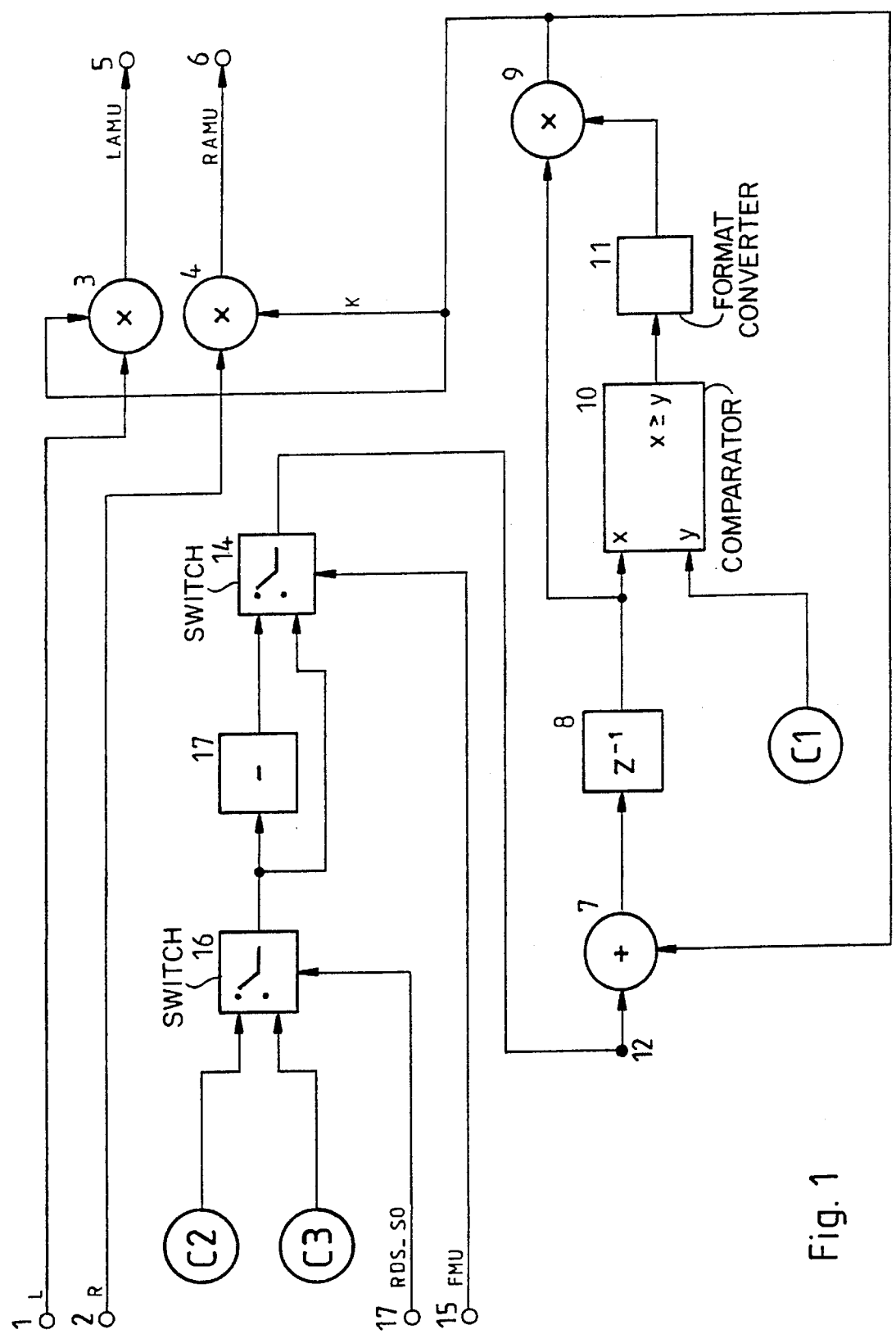

The circuit in accordance with FIG. 1 is supplied with audio signals L (left) and R (right) via inputs 1, 2. After respectively passing through a multiplier 3, 4 the audio signals LAMU and RAMU can be picked up at the outputs 5, 6, damped, if required. A factor K is supplied to the multipliers 3, 4 which, in the normal case, has a maximum value of 1 and which is brought to a minimum value of 0 for muting. In this case, the change takes place in accordance with a predetermined time function, so that no crackling noises are generated by the change itself.

An integrator is provided for deriving the factor K, which consists essentially of an adder 7 and a delay 8 by one sampling period. The output value of the delay 8 is hereinafter designated as the integration value and is passed through a further multiplier 9, in which a multiplication by 1 or 0 takes place. In the case of multiplication by 1, the factor K corresponds to the integration value while, in the case of multiplication by 0, the factor K=0. The latter is necessary to keep the factor K at 0 should the integration value take on negative values. For this purpose, the integration value is supplied to the input of a comparator 10, at the further input of which a constant C1, representing the minimum value, is present. At a minimum value of 0, C1 then is 0. In that case the output $x \geq y$ of the comparator 10, which carries a one-bit signal, is connected via a format converter 11 for conversion into a 16-bit signal with the multiplier 9. The upper limitation of the factor K to the maximum value is not shown in FIG. 1. It can be designed similarly to that of the limitation to the minimum value.

The integration increment supplied to the adder 7 at 12 can be provided with different signs for reducing or increasing the factor K. A negator 17 and a changer 14, which can be controlled by a control signal FMU which can be supplied to an input 15, are provided for this purpose.

By means of a further changer 16, which can be controlled with the aid of a control signal RDS_SO which can be supplied at 17, it is possible to use two different integration increments C2 and C3 selectively. With a value of, for example 0.0219, the one integration element C2 causes a rapid change of the factor K, which is advantageous for short-lived switching of the reception frequency for test purposes. A slower change of the signal K can take place for other cases of muting, for example in the course of normal station-seeking or changes between different audio signal sources, and the integration increment C3 is used for this which, for example, has a value of 0.000219.

Figure 2:
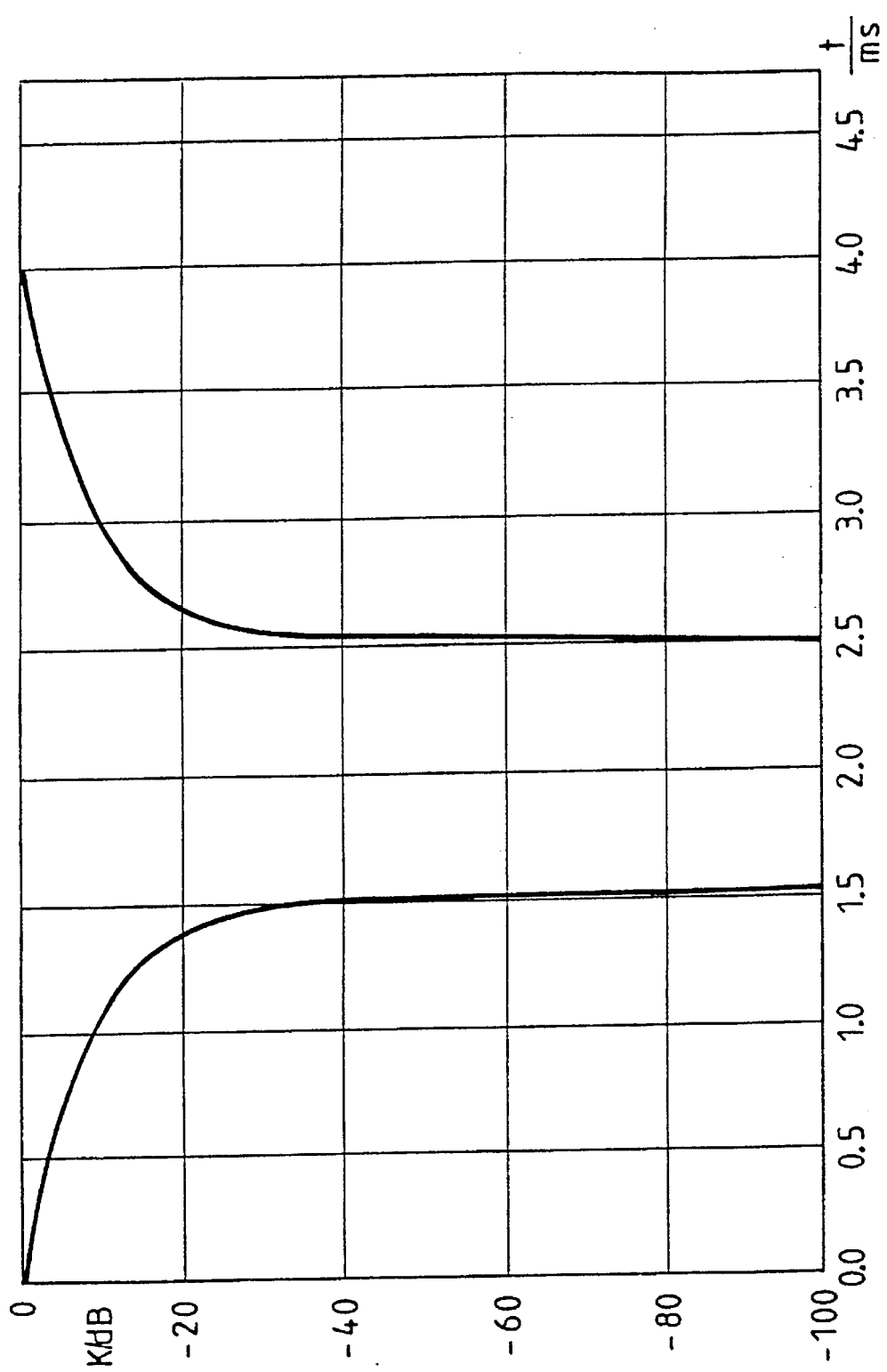

FIG. 2 shows an exemplary embodiment of a mute curve, wherein the time in milliseconds (ms) is entered on the abscissa and the damping achieved on a logarithmic scale is shown on the ordinate in dB (decibels). The muting process starts at the time 0 and attains a damping of −40 dB after 1.5 ms. The sound restoration process which is complementary to this starts at the time 2.5 ms. The curve shown is obtained with an integration increment of 0.0146. The, at first flat, course of the curve is particularly advantageous, and it then falls off very steeply into intense damping. With this course, it is possible to achieve muting which is to a large degree "free of crackling".

Various changes and modifications may be made, and features described in connection with any one of the embodiments may be used with any of the others, within the scope of the inventive concept.

What is claimed is:

1. A circuit for suppressing short-lived noise phenomena in a digital audio signal, in particular during a temporary test reception of another transmitter, comprising multiplying means (3, 4) for multiplying the audio signal by a factor (K) which, prior to the appearance of the noise phenomenon, is adjusted non-linearly from a maximum value to a minimum value in accordance with a predetermined non-linear time function thereby damping the audio signal, and, at the end of the noise phenomenon, is returned, non-linearly, to a maximum value; and an integrator (7, 8) comprising an adder (7) and a delay element (8) which retards the signal, said integrator deriving said factor (K) and having its output coupled to said multiplying means.

2. A circuit in accordance with claim 1, wherein, said integrator provides said factor (K), in accordance with the predetermined time function for damping on a logarithmic scale, which function, starting with a maximum value of the factor, first extends essentially flat and then increasingly more steeply to a minimum value and, then, beginning with the minimum value, first extends steeply and then increasingly flatter towards the maximum value.

3. A circuit in accordance with claim 1, comprising means (C2, C3, 14, 16, 17) for controlling the integration increment of the integrator (7, 8).

4. A circuit in accordance with claim 1, wherein the adder (7) is provided with a value representing an integration increment and further with the derived factor of the preceding sampling period;

the output signal of the adder (7), delayed by one sampling period, is supplied to one input of a multiplier (9) and to an input of a comparator (10), another input of the comparator (10) being supplied with a constant, which represents the minimum value; and the output of the comparator (10) is connected with a further input of the multiplier (9), the multiplied result forming the factor (K) at the output of the multiplier (9).

5. A circuit in accordance with claim 1, comprising control signal supply means (15, FMU) coupled (14) to the integrator for controlling the sign of integration.

6. A circuit in accordance with claim 1, comprising integration rate control signal supply means (C2, C3, 16, 17) coupled to the integrator for controlling the integration rate.

7. A circuit in accordance with claim 1, wherein the audio signal (L) of a left stereo channel and the audio signal (R) of a right stereo channel are multiplied by said factor (K).

8. A circuit in accordance with claim 1, wherein said integrator provides said factor (K), in accordance with the predetermined time function for damping on a logarithmic scale, which function, starting with a maximum value of the factor, first extends essentially flat and then increasingly more steeply to a minimum value and, then, beginning with the minimum value, first extends steeply and then increasingly flatter towards the maximum value;

wherein the output signal of the adder (7), delayed by one sampling period, is supplied to one input of a multiplier (9) and to an input of a comparator (10), another input of the comparator (10) being supplied with a constant, which represents the minimum value; and the output of the comparator (10) is connected with a further input of the multiplier (9), the multiplied result forming the factor (K) at the output of the multiplier (9).

9. A circuit in accordance with claim 1, comprising means (C2, C3, 14, 16, 17) for controlling the integration rate of the integrator (7, 8); and wherein said integrator provides said factor (K), in accordance with the predetermined time function for damping on a logarithmic scale, which function, starting with a maximum value of the factor, first extends essentially flat and then increasingly more steeply to a minimum value and, then, beginning with the minimum value, first extends steeply and then increasingly flatter towards the maximum value.

10. A circuit in accordance with claim 1, comprising control signal supply means (15, FMU) coupled (14) to the integrator for controlling the sign of integration; and wherein said integrator provides said factor (K), in accordance with the predetermined time function for damping on a logarithmic scale, which function, starting with a maximum value of the factor, first extends essentially flat and then increasingly more steeply to a minimum value and, then, beginning with the minimum value, first extends steeply and then increasingly flatter towards the maximum value.

11. A circuit in accordance with claim 7, comprising integration rate control signal supply means (C2, C3, 16, 17) coupled to the integrator for controlling the integration rate response to another supplied control signal; and wherein said integrator provides said factor (K), in accordance with the predetermined time function for damping on a logarithmic scale, which function starting with a maximum value of the factor, first extends essentially flat and then increasingly more steeply to a minimum value and, then, beginning with the minimum value, first extends steeply and then increasingly flatter towards the maximum value.

12. A circuit in accordance with claim 1, wherein the audio signal (L) of a left stereo channel and the audio signal (R) of a right stereo channel are multiplied by said factor (K); and wherein said integrator provides said factor (K), in accordance with the predetermined time function for damping on a logarithmic scale, which function, starting with a maximum value of the factor, first extends essentially flat and then increasingly more steeply to a minimum value and, then, beginning with the minimum value, first extends steeply and then increasingly flatter towards the maximum value.

13. A circuit in accordance with claim 8, comprising control signal supply means (15, FMU) coupled (14) to the integrator for controlling the sign of integration.

14. A circuit in accordance with claim 8, comprising integration rate control signal supply means (C2, C3, 16, 17) coupled to the integrator for controlling the integration rate.

* * * * *